(12) United States Patent
Wu

(10) Patent No.: US 10,566,306 B2
(45) Date of Patent: Feb. 18, 2020

(54) WIRING STRUCTURE OF GLASS SUBSTRATE, GLASS SUBSTRATE AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Huanda Wu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 250 days.

(21) Appl. No.: 15/745,121

(22) PCT Filed: Oct. 30, 2017

(86) PCT No.: PCT/CN2017/108287
§ 371 (c)(1),
(2) Date: Jan. 15, 2018

(87) PCT Pub. No.: WO2019/071657
PCT Pub. Date: Apr. 18, 2019

(65) Prior Publication Data
US 2019/0385970 A1  Dec. 19, 2019

(30) Foreign Application Priority Data

Oct. 11, 2017 (CN) .......................... 2017 1 0939964

(51) Int. Cl.
*H01L 23/00* (2006.01)
*G02F 1/1345* (2006.01)

(52) U.S. Cl.
CPC .......... *H01L 24/49* (2013.01); *G02F 1/13452* (2013.01); *H01L 2924/14* (2013.01); *H01L 2924/17788* (2013.01)

(58) Field of Classification Search
CPC ..................... H01L 23/00; H01L 24/49; H01L 2924/17788; G02F 1/1345; G02F 1/13452
(Continued)

(56) References Cited

U.S. PATENT DOCUMENTS 8,068,083 B2* 11/2011 Shirai .................. G09G 3/3688
 345/204
2008/0100605 A1* 5/2008 Shirai .................. G09G 3/3688
 345/206

FOREIGN PATENT DOCUMENTS

CN 101174036 A 5/2008
CN 101197117 A 6/2008

* cited by examiner

*Primary Examiner* — Alexander O Williams
(74) *Attorney, Agent, or Firm* — Hemisphere Law, PLLC; Zhigang Ma

(57) ABSTRACT

The disclosure provides a wiring structure of a glass substrate used between a demultiplexer MUX and an integrated circuit IC. The siring structure includes a plurality of connecting lines, two ends of each connecting line are connected to the MUX and the IC, and a predetermined spacing is reserved between any two adjacent connecting lines. Wherein one or more conductive convex teeth are provided on at least one connecting line, and a predetermined distance is reserved between each convex tooth on any one of the connecting lines and an adjacent connecting line thereof or each convex tooth on the adjacent connecting line. The disclosure also provides a glass substrate and a display device. Performing the disclosure may reduce the resistance of the wiring in the present limited wiring space and improve the charging effect of the glass substrate.

20 Claims, 1 Drawing Sheet

(58) Field of Classification Search
USPC .......................................................... 257/678
See application file for complete search history.

WIRING STRUCTURE OF GLASS SUBSTRATE, GLASS SUBSTRATE AND DISPLAY DEVICE

RELATED APPLICATIONS

The present application is a National Phase of International Application Number PCT/CN2017/108287, filed Oct. 30, 2017, and claims the priority of China Application No. 201710939964.6, filed Oct. 11, 2017.

FIELD OF THE DISCLOSURE

The disclosure relates to a display technical field, and more particularly to a wiring structure of a glass substrate, a glass substrate and a display device.

BACKGROUND

With the development of the flat panel display industry, higher requirements on the fineness of the picture display are constantly set forth by modern people. With a display chosen with a high ppi (Pixels per Inch, the number of pixels included in per inch) becomes a standard configuration of a digital electronic product.

As shown in FIG. 1, in the process of fabricating the TFT glass substrate of the high ppi display, a demultiplexer (MUX) is connected to an integrated circuit (IC) basically by a plurality of connecting lines with equal spacing and equal width. However, due to the limitation by the wiring space between the MUX and the IC, the resistance of the wiring has not been improved, leading to being unable to improve the charging effect of the glass substrate.

SUMMARY

A technical problem to be solved by the disclosure is to provide a wiring structure of a glass substrate, a glass substrate and a display device, it may reduce the resistance of the wiring in the present limited wiring space and improve the charging effect of the glass substrate.

In order to solve the technical problem, embodiments of the disclosure provide a wiring structure of a glass substrate, used between a demultiplexer MUX and an integrated circuit IC, including a plurality of connecting lines, two ends of each connecting line being connected to the MUX and the IC, and a predetermined spacing being reserved between any two adjacent connecting lines.

Wherein one or more conductive convex teeth are provided on at least one connecting line, and a predetermined distance is reserved between each convex tooth on any one of the connecting lines and an adjacent connecting line thereof or each convex tooth on the adjacent connecting line.

Wherein the convex teeth on the opposite sides between any two adjacent connecting lines are arranged in a staggered interlocking manner.

Wherein a length of any one of the connecting lines is a shortest distance between the MUX and the IC.

Wherein any one of the convex teeth is made of the same material as that of a connecting line connected thereof.

Wherein any two adjacent connecting lines are made of different materials.

Wherein the connecting lines with odd-numbered arrangement distribution are made of the same material, and the connecting lines with even-numbered arrangement distribution are made of the same material.

Wherein the making materials of the connecting lines include metal aluminum and metal molybdenum.

Correspondingly, the embodiments of the disclosure also provide a glass substrate, including a wiring structure of the glass substrate, the wiring structure of the glass substrate including a wiring structure of the glass substrate, the wiring structure of the glass substrate being used between a demultiplexer MUX and an integrated circuit IC, including a plurality of connecting lines, two ends of each connecting line being connected to the MUX and the IC, and a predetermined spacing being reserved between any two adjacent connecting lines.

Wherein one or more conductive convex teeth are provided on at least one connecting line, and a predetermined distance is reserved between each convex tooth on any one of the connecting lines and an adjacent connecting line thereof or each convex tooth the adjacent connecting line.

Wherein the convex teeth on the opposite sides between any two adjacent connecting lines are arranged in a staggered interlocking manner.

Wherein a length of any one of the connecting lines is a shortest distance between the MUX and the IC.

Wherein any one of the convex teeth is made of the same material as that of a connecting line connected thereof.

Wherein any two adjacent connecting lines are made of different materials.

Wherein the connecting lines with odd-numbered arrangement distribution are made of the same material, and the connecting lines with even-numbered arrangement distribution are made of the same material.

Wherein making materials of the connecting line include metal aluminum and metal molybdenum.

Correspondingly, the embodiments of the disclosure also provide a display device, including: a glass substrate, the glass substrate including a wiring structure of a glass substrate, the wiring structure of the glass substrate being used between a demultiplexer MUX and an integrated circuit IC, including a plurality of connecting lines, two ends of each connecting line being connected to the MUX and the IC, and a predetermined spacing being reserved between any two adjacent connecting lines.

Wherein one or more conductive convex teeth provided are on at least one connecting line, and a predetermined distance is reserved between each convex tooth on any one of the connecting lines and an adjacent connecting line thereof or each convex tooth on the adjacent connecting line.

Wherein the convex teeth on the opposite sides between any two adjacent connecting lines are arranged in a staggered interlocking manner.

Wherein a length of any one of the connecting lines is a shortest distance between the MUX and the IC.

Wherein any one of the convex teeth is made of the same material as that of a connecting line connected thereof.

Wherein any two adjacent connecting lines are made of different materials.

Wherein the connecting lines with odd-numbered arrangement distribution are made of the same material, and the connecting lines with even-numbered arrangement distribution are made of the same material.

The implementation of embodiments of the disclosure has the following advantageous effect.

Comparing with the wiring structure of the glass substrate achieved by the prior art, in the disclosure, conductive convex teeth are provided on the connecting lines of the original MUX and IC, and the wiring area of the connecting line is increased by the convex teeth to reduce the resistance of the connecting line, so as to reduce the resistance of the wiring in the present limited wiring space and improve the charging effect of the glass substrate.

BRIEF DESCRIPTION OF THE DRAWINGS

In order to more clearly illustrate the prior art or the embodiments or aspects of the practice of the disclosure, the accompanying drawings for illustrating the prior art or the embodiments of the disclosure are briefly described as below. It is apparently that the drawings described below are merely some embodiments of the disclosure, and those skilled in the art may derive other drawings according the drawings described below without creative endeavor.

DETAILED DESCRIPTION OF PREFERRED EMBODIMENTS

The following description with reference to the accompanying drawings is provided to explain the exemplary embodiments of the disclosure.

Figure 1:
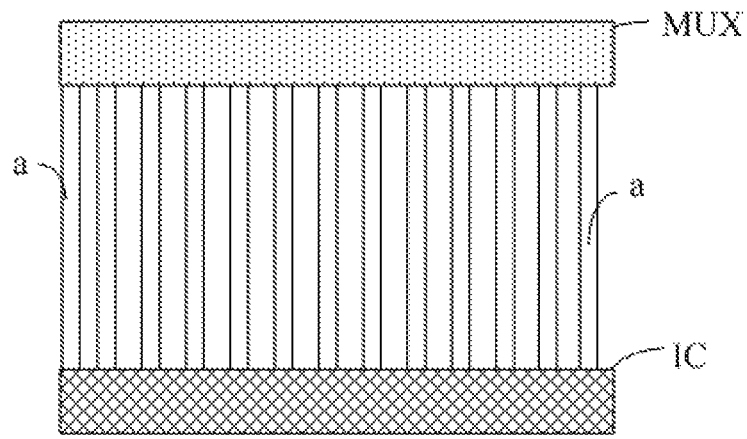
FIG. 1 is a partial cross-sectional structural schematic view of a wiring structure of a glass substrate in the prior art.
Figure 2:
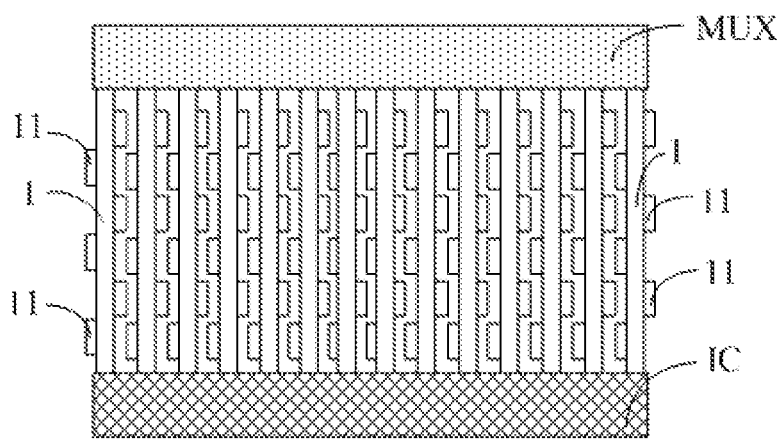
FIG. 2 is a partial cross-sectional structural schematic view of a wiring structure of a glass substrate according to a first embodiment of the disclosure.

Refer to FIG. 2, in the first embodiment of the disclosure, a wiring structure of a glass substrate is used between a demultiplexer MUX and an integrated circuit IC. The wiring structure includes a plurality of connecting lines 1, two ends of each connecting line 1 are connected to the MUX and the IC, and a predetermined spacing is reserved between any two adjacent connecting lines 1.

Wherein one or more conductive convex teeth 11 are provided on at least one connecting line 1, and a predetermined distance is reserved between each convex tooth 11 on any one of the connecting lines 1 and an adjacent connecting line 1 thereof or each convex tooth 11 on the adjacent connecting line 1.

It can be understood that the convex teeth 11 on the connecting line 1 is neither intersecting with the adjacent connecting line nor intersecting with the any one of the convex teeth 11 on the adjacent connecting line 1, such that in the original limited wiring space, the wiring area of the connecting line 1 is increased by the convex teeth 11 without increasing the wiring length of any one of the connecting lines 1, thereby reducing the resistance of the connecting lines 1 to the greatest extent.

Further, the convex teeth 11 on the opposite sides between any two adjacent connecting lines 1 are arranged in a staggered interlocking manner, such that wiring area of adjacent connecting lines 1 may be increased to the greatest extent and no interference may occur.

Further, a length of any one of the connecting lines 1 is a shortest distance between the MUX and the IC, such that in the original limited wiring space, the distribution intensity (i.e., the number) of the connecting lines 1 may be increased, so as to further ensure the communication between the MUX and the IC. Definitely, the width between the any two adjacent connecting lines 1 is equal, such that the wiring structure is more convenient and more reasonable.

Further, any one of the convex teeth 11 is made of the same material as that of the connecting line 1 connected thereof. Sudden changes of the resistance do not occur in the connecting line 1 due to different materials. For example, the connecting lines 1 are made of metal aluminum and metal molybdenum, such that the convex teeth 11 corresponding to the connecting lines 1 made of metal molybdenum are also made of metal aluminum, and the convex teeth 11 corresponding to the connecting lines 1 made of metal aluminum are also made of metal molybdenum.

Further, any two adjacent connecting lines 1 are made of different materials, such that the inference between the adjacent connecting lines 1 may be reduced. It should be noted that in order to improve the anti-interference between the adjacent connecting lines 1, the insulating materials may be filled between any adjacent connecting lines 1.

Further, the connecting lines with odd-numbered arrangement distribution are made of the same material, and the connecting lines with even-numbered arrangement distribution are made of the same material, such that the use of two different materials alternately distributing is conducive to to the design and the anti-interference.

Comparing with wiring structure of the glass substrate in the first embodiment, a second embodiment of the disclosure also provides a glass substrate including a wiring structure of the glass substrate in the first embodiment of the disclosure. Since the wiring structure of the glass substrate in the second embodiment and the wiring structure of the glass substrate in the first embodiment of the disclosure include the same structure and the same connecting relationship, the description thereof does not repeat any more.

Comparing with the glass substrate in the second embodiment, a third embodiment of the disclosure provides a display device including the glass substrate in the second embodiment of the disclosure. Since the display device in the third embodiment of the disclosure and the wiring structure of the glass substrate in the second embodiment of the disclosure include the same structure and the same connecting relationship, the description thereof does not repeat any more.

In summary, comparing with the wiring structure of the glass substrate achieved by the prior art, conductive convex teeth are provided on the connecting lines of the original MUX and IC, and the wiring area of the connecting line is increased by the convex teeth to reduce the resistance of the connecting line, so as to reduce the resistance of the wiring in the present limited wiring space and improve the charging effect of the glass substrate.

The foregoing disclosed contents are merely specific preferred embodiments and the protection scope of the invention can not be limited by such preferred embodiments. Equivalent modifications can be made in accordance with the claims of the invention and should be included in the protection scope of the application.

What is claimed is:

1. A wiring structure of a glass substrate, used between a demultiplexer MUX and an integrated circuit IC, comprising a plurality of connecting lines, two ends of each connecting line being connected to the MUX and the IC, and a predetermined spacing being reserved between any two adjacent connecting lines, wherein, one or more conductive convex teeth are provided on at least one connecting line, and a predetermined distance is reserved between each convex tooth on any one of the connecting lines and an adjacent connecting line thereof or each convex tooth on the adjacent connecting line.

2. The wiring structure of the glass substrate according to claim 1, wherein the convex teeth on the opposite sides between any two adjacent connecting lines are arranged in a staggered interlocking manner.

3. The wiring structure of the glass substrate according to claim 2, wherein a length of any one of the connecting lines is a shortest distance between the MUX and the IC.

4. The wiring structure of the glass substrate according to claim 3, wherein any one of the convex teeth is made of the same material as that of a connecting line connected thereof.

5. The wiring structure of the glass substrate according to claim 4, wherein any two adjacent connecting lines are made of different materials.

6. The wiring structure of the glass substrate according to claim 5, wherein the connecting lines with odd-numbered arrangement distribution are made of the same materials, and the connecting lines with even-numbered bits arrangement distribution are made of the same material.

7. The wiring structure of the glass substrate according to claim 6, wherein the making materials of the connecting lines comprise metal aluminum and metal molybdenum.

8. A glass substrate, comprising: a wiring structure of a glass substrate, the wiring structure of the glass substrate used between a demultiplexer MUX and an integrated circuit IC, comprising a plurality of connecting lines, two ends of each connecting line being connected to the MUX and the IC, and a predetermined spacing being reserved between any two adjacent connecting lines, wherein,
   one or more conductive convex teeth are provided on at least one connecting line, and a predetermined distance is reserved between each convex tooth on any one of the connecting lines and an adjacent connecting line thereof or each convex tooth on the adjacent connecting line.

9. The glass substrate according to claim 8, wherein the convex teeth on the opposite sides between any two adjacent connecting lines are arranged in a staggered interlocking manner.

10. The glass substrate according to claim 8, wherein a length of any one of the connecting lines is a shortest distance between the MUX and the IC.

11. The glass substrate according to claim 10, wherein any one of the convex teeth is made of the same material as that of a connecting line connected thereof.

12. The glass substrate according to claim 11, wherein any two adjacent connecting lines are made of different materials.

13. The glass substrate according to claim 12, wherein the connecting lines with odd-numbered arrangement distribution are made of the same material, and the connecting lines with even-numbered arrangement distribution are made of the same material.

14. The glass substrate according to claim 13, wherein making materials of the connecting lines comprise metal aluminum and metal molybdenum.

15. A display device, comprising: a glass substrate, the glass substrate comprising a wiring structure of a glass substrate, the wiring structure of the glass substrate being used between a demultiplexer MUX and an integrated circuit IC, comprising a plurality of connecting lines, both ends of each connecting line being connected to the MUX and the IC, and a predetermined spacing being reserved between any adjacent connecting lines, wherein,
   one or more conductive convex teeth are provided on at least one connecting line, and a predetermined distance is reserved between each convex tooth on any one of the connecting lines and an adjacent connecting line thereof or each convex tooth on the adjacent connecting line.

16. The display device according to claim 15, wherein the convex teeth on the opposite sides between any two an adjacent connecting lines are arranged in a staggered interlocking manner.

17. The display device according to claim 16, wherein a length of any one of the connecting lines is a shortest distance between the MUX and the IC.

18. The display device according to claim 17, wherein any one of the convex teeth is made of the same material as that of a connecting line connected thereof.

19. The display device according to claim 18, wherein any two adjacent connecting lines are made of different materials.

20. The display device according to claim 19, wherein the connecting lines with odd-numbered arrangement distribution are made of the same material, and the connecting lines with even-numbered arrangement distribution are made of the same material.

* * * * *